United States Patent
Murata et al.

[11] Patent Number: 5,772,038
[45] Date of Patent: Jun. 30, 1998

[54] PARTS TRANSPORTING TRAY

[75] Inventors: Kentaro Murata, Yao; Noriho Matsuzoe, Nishinomiya; Takao Emoto, Yokosuka; Hisayoshi Kunii, Sagamihara, all of Japan

[73] Assignees: Gold Industries Co., Ltd., Osaka; Kabushiki Kaisha Toshiba, Kanagawa, both of Japan

[21] Appl. No.: 872,076

[22] Filed: Jun. 10, 1997

[30] Foreign Application Priority Data

Jun. 10, 1996 [JP] Japan ..................................... 8-171874

[51] Int. Cl.$^6$ ................................................. B65D 73/02
[52] U.S. Cl. .......................... 206/725; 206/564; 220/23.4
[58] Field of Search ................................... 206/701, 710, 206/711, 712, 722, 725, 564, 521; 220/23.2, 23.4, 23.83, 23.6

[56] References Cited

U.S. PATENT DOCUMENTS 4,583,640  4/1986  Gillam ............................... 220/23.4 X
5,310,076  5/1994  Burton et al. ........................ 206/725 X
5,547,082  8/1996  Royer et al. .............................. 206/725

*Primary Examiner*—Jacob K. Ackun
*Attorney, Agent, or Firm*—Edwin E. Greigg; Ronald E. Greigg

[57] ABSTRACT

A parts transporting tray (1) has a rectangular body, a plurality of parts receiving pits (6) formed in the upper face of the body, rows of detention means (2) each formed along one of perimeters of the body such that the adjacent trays can engage one with another, and a locking means (5) for keeping engaged the detention means of the adjacent trays. Each row consists of an upper and lower series of recesses (3) and protrusions (4) alternating one another at a constant pitch and being of a half thickness of the body. The protrusions on one perimeter are staggered with respect to those on the other perimeter, and each protrusion having a hooking portion (4a) facing transverse sides of the tray's body. The protrusions on one tray can loosely fit in the recesses on the other tray, and the trays are caused to slide relatively so that the protrusions on the neighboring trays engage with the recesses when a desired number of the trays are disintegratively connected one to another.

20 Claims, 7 Drawing Sheets

5,772,038

PARTS TRANSPORTING TRAY

BACKGROUND OF THE INVENTION

1. Field of the Invention

The present invention relates to a parts transporting tray adapted to hold thereon and carry a plurality of semiconductor devices such as various integrated circuit chips and memory chips or auxiliary electric parts (for example connectors, switches or transmitters), so as to transport them into and out of an assembly line or inspection line for manufacture of electronic apparatuses. The tray provided herein, and usable also to convey the small mechanical parts of any precision machines, is intended for side-by-side combination with a plurality of such trays of the same type in order that a tray assembly may be formed on demand.

2. Description of the Prior Art

Factory lines for automatically assembling electronics or precision apparatuses have been and are now operated with use of a great number of trays. These trays are generally thin and rectangular plastic plates each having a plurality of parts receiving compartments so that the parts are transported as a group onto or away from the assembly lines.

In general, those prior art trays have been designed to be of predetermined unchangeable sizes. Accordingly, such trays of several different sizes must be involved, taking into account the varied characteristics peculiar to the manufacture sites. The dimensions of the trays depends upon the number of the devices or parts required at one time at a given work station. It is not easy to simultaneously form a plurality of large trays of plastic, for instance within an injection mold. A machine for molding such large trays is substantial in size and expensive. Further, it is somewhat troublesome for manufacture lines to operate with those trays of various dimensions or types, elevating the operating cost incurred by the trays.

OBJECT AND SUMMARY OF THE INVENTION

An object of the present invention made in view of the described problems is therefore to provide a parts transporting tray such that any required number thereof can firmly be jointed to and readily disjointed from each other. An assembly of the trays thus mutually connected may be constructed into any desired overall size and would function like a much larger-sized single tray.

In order to achieve this object, a parts transporting tray provided herein comprises: a rectangular body of an overall thickness and having an upper face, two opposing longitudinal sides extending longitudinally of the body in parallel with each other and two transverse sides perpendicular thereto; a plurality of parts receiving compartments formed in the upper face; two rows of detention means respectively formed extending laterally from and integrally with the longitudinal sides such that the adjacent trays are capable of firmly engaging one with another; and a locking means for releasably keeping engaged the detention means of the adjacent trays. Each row of the detention means consists of an upper and lower series of protrusions and recesses formed at a constant pitch, wherein each series is one of two complementary portions of the overall thickness of the body. Each recess in the upper series is defined above the corresponding protrusion of the lower series and between the adjacent two protrusions of the upper series, with each protrusion of the lower series thereby serving as a bottom of the corresponding recess of the upper series. Each protrusion has a hooking portion that faces either transverse side, and the protrusions included in both the series on each longitudinal side are staggered, with both the protrusions in each series on one longitudinal side being also staggered with respect to the protrusions included in the corresponding series on the other longitudinal side. In assembling together the protrusions on one tray are made to loosely fit in the respective recesses on the other tray, and subsequently the one tray is caused to slide relative to the other until the adjacent protrusions in each series on the trays come into engagement with each other at their hooking portions, so as to be kept in this state by the locking means.

In one of the most desirable modes of the present invention, each series in the row of the protrusions and recesses is substantially half the overall thickness of the body.

BRIEF DESCRIPTION OF THE DRAWINGS

The present invention will now be described in detail referring to the drawings, in which.

DETAILED DESCRIPTION OF THE PREFERRED EMBODIMENTS

Figure 1:
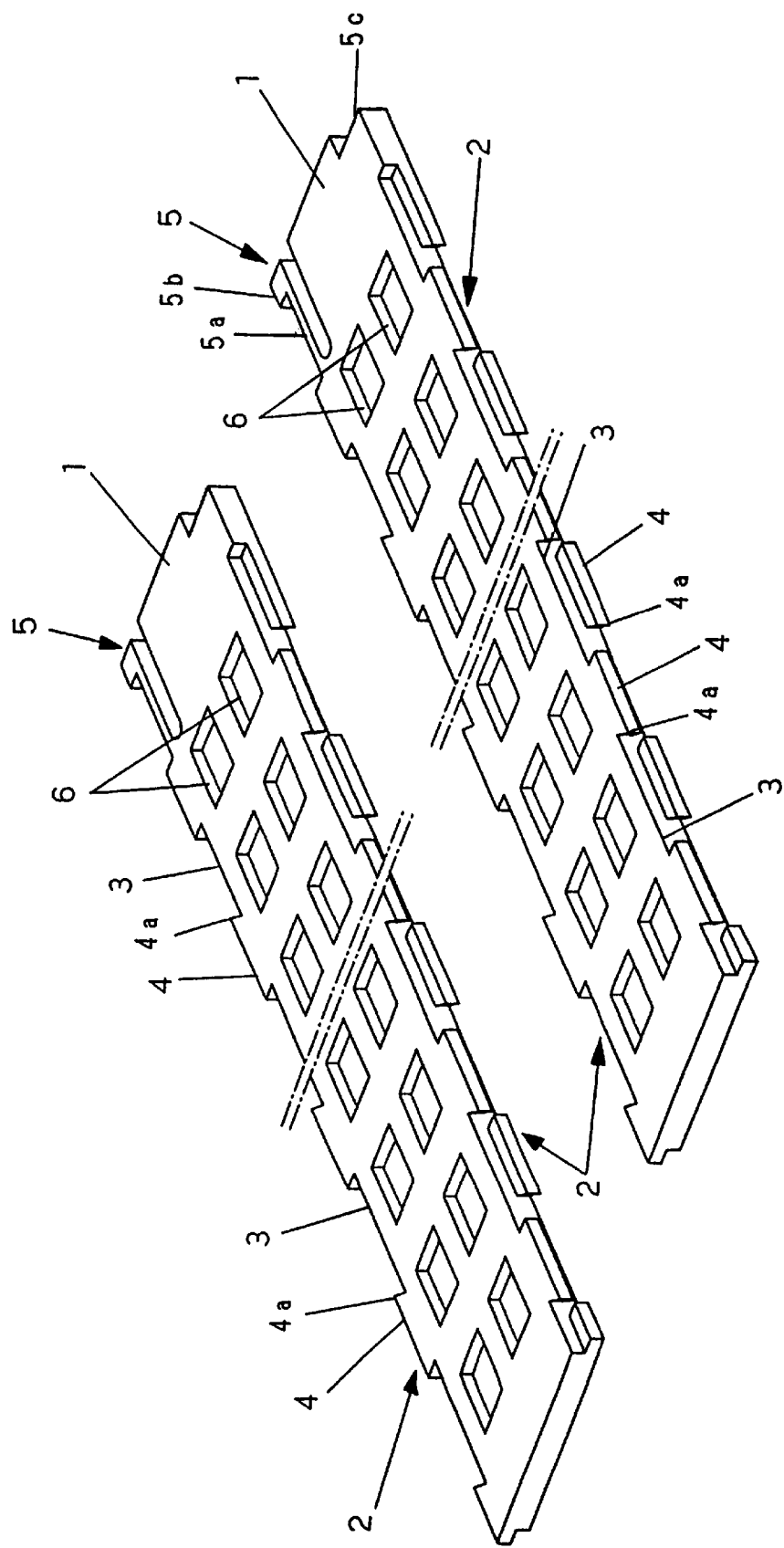
FIG. 1 is a perspective view of two trays shown in their position disposed side by side and each provided in a first embodiment, wherein each tray comprises detention means and a locking means.
Figure 2:
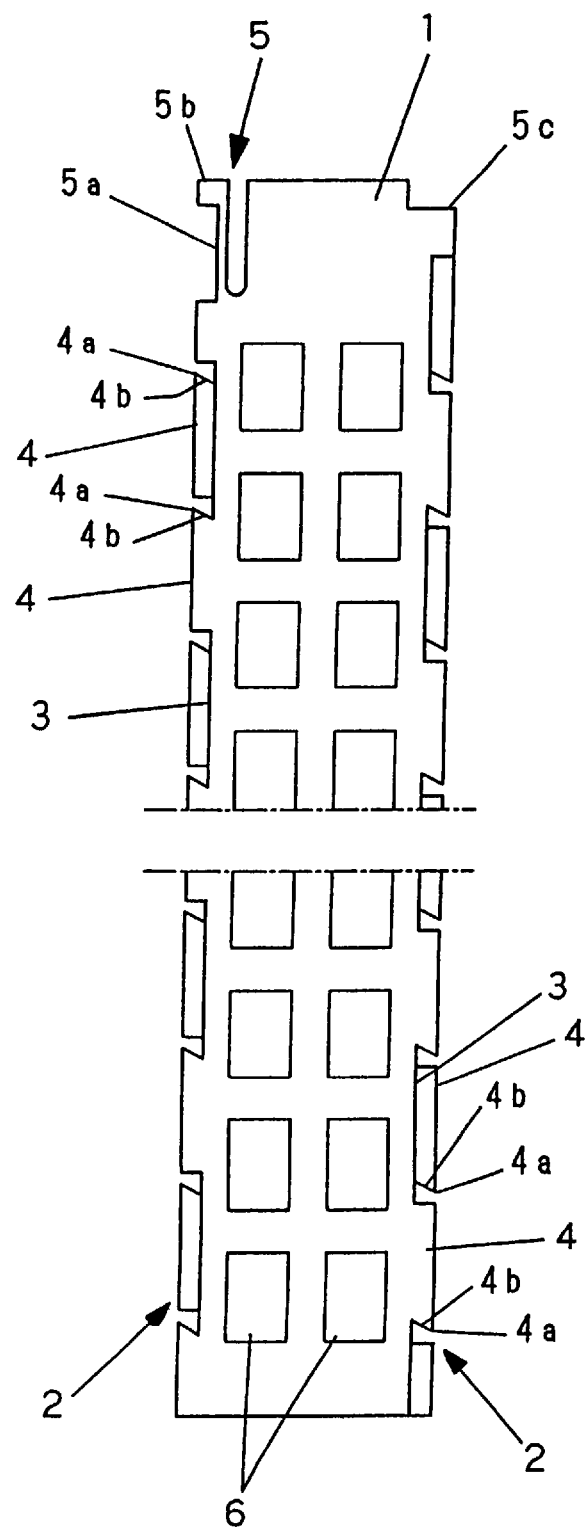
FIG. 2 is a plan view of the tray illustrated in FIG. 1.

In FIGS. 1 to 5 showing a first embodiment of the invention, a parts transporting tray 1 comprises a rectangular plate made of a plastic to have an upper face and sides extending longitudinally of the tray. A plurality of parts receiving compartments 6 are formed in the upper face. Detention means 2 formed along and integrally with the longitudinal sides are nearly symmetrical with respect to a center line (not shown) of the rectangular plate. Strictly speaking, these detention means are positioned in a zig-zag pattern and therefore are referred to herein as being "staggered".

The detention means 2 on each longitudinal side of the upper face consists of protrusions 4 and recesses 3 alternating with one another at a constant pitch in the direction of the center line. Each recess 3 is defined above its bottom and between the two neighboring protrusions 4. The depth of the protrusions 4 and the bottoms of recesses 3 are half the thickness of said rectangular plate. The protrusions 4 are of a shape resembling square wave pulses as if appearing along one longitudinal side, and are arranged in a staggered location with respect to the protrusions 4 formed along the other longitudinal side. The bottom of each recess 3 on the upper face constitutes a protrusion 4 on a lower face of the plate, with each protrusion 4 on the upper face serving as a bottom of a recess 3 on the lower face. Thus, an upper and lower series of protrusions and recesses are provided along each longitudinal side of the tray 1. Each of the protrusions 4 as well as each of the recess bottoms 3 have hooking portions 4a. Each hooking portion 4a facing either transverse side of the tray's body is an edge of an acute angle defined by and between a slant 4b and a lateral side of protrusion.

The dimension of the described protrusions and recesses are such that the protrusions 4 on one tray are allowed to loosely fit at first in the respective recesses 3 on the other tray adjacent to the one tray. Subsequently, the one tray will be caused to slide relative to the other tray whereby the adjacent protrusions on the neighboring trays come into engagement with each other, with the recess bottoms adjacent to each other and formed in the neighboring trays also being brought into engagement with each other. A locking means 5 is provided so as to releasably keep engaged the detention means of the adjacent trays at their hooking portions 4a.

Figure 4:
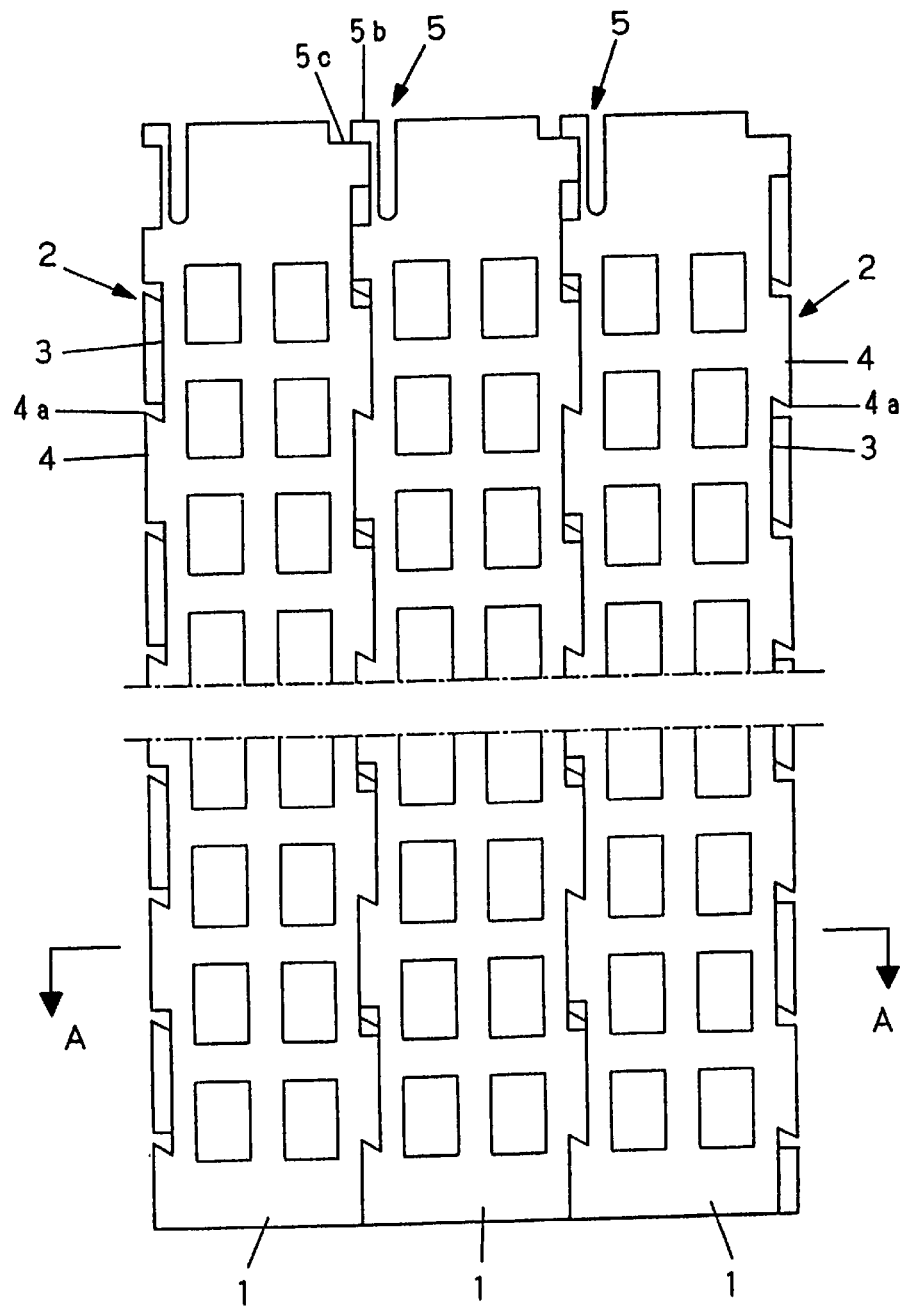
FIG. 4 is a plan view of three trays firmly connected one to another and each being the same as those shown in FIG. 1.
Figure 5:
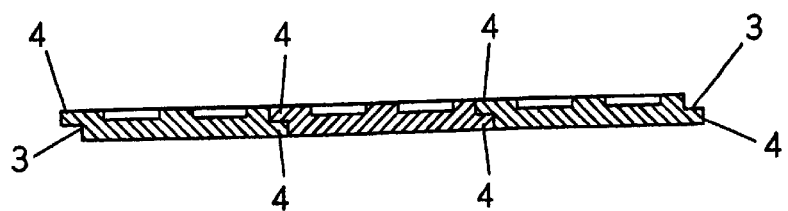
FIG. 5 is a cross section taken along the line A—A in FIG. 4.
Figure 11:
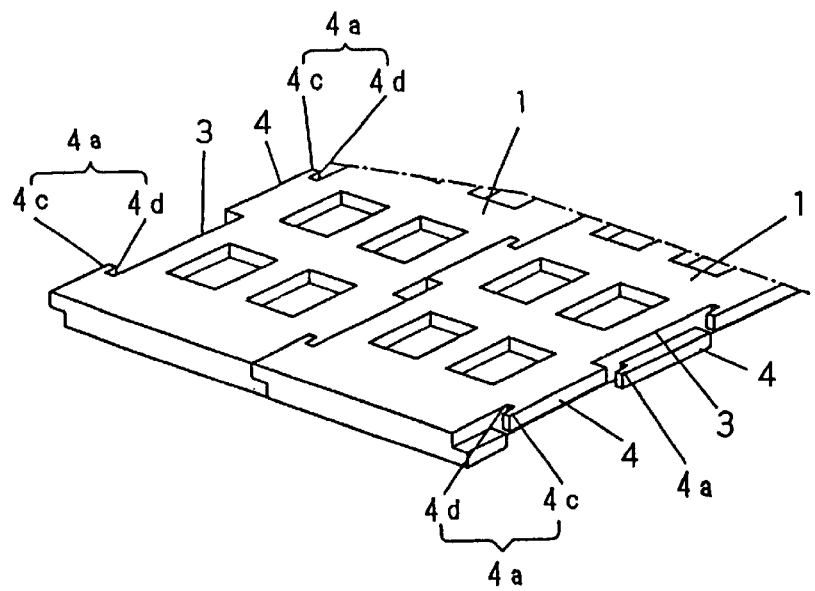
FIG. 11 is a perspective view of a modified example of the detention means.

The hooking portions 4a are shaped such that the trays mutually connected in a manner shown in FIG. 4 are inhibited from separating sideways from each other (viz., to the right or to the left in FIG. 4). Alternatively a U-shaped hooking portion which a second embodiment provides, as seen in FIG. 11, may substitute for each hooking portion 4a having the slant 4b employed in the first embodiment. The U-shaped portion has an L-shaped leg that defines between it and the tray body's longitudinal side a groove, thereby preferably improving the strength of mutual connection of the adjacent trays.

Figure 3:
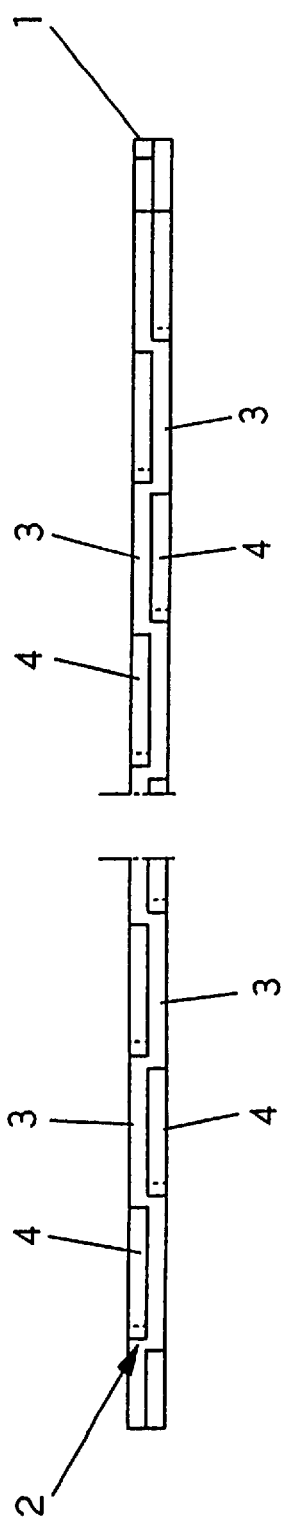
FIG. 3 is a side elevation of the tray also shown in FIG. 1.

The locking means 5 mentioned above comprises in the first embodiment a resilient pawl 5a and a lug 5c. Both the pawl and the lug are formed integral with the tray's body at its portion located close to one of the transverse sides. The resilient pawl 5a is located on one of the lateral sides of said body, with the lug 5c being on the other lateral side. The pawl 5a having at its end an outwardly protruding tab 5b engageable with the lug 5c will resist any transverse force imparted sideways thereto, to maintain its neutral position lying in parallel with the body of the tray. The adjoining trays will be connected one to another by inserting the protrusions 4 into the mating recesses 3 and by subsequently sliding the trays relative to each other until the tab 5b of the resilient pawl of one tray comes into engagement with a shoulder of the lug 5c on an adjoining tray. Thus, the pawl caught by the lug will prevent the hooking portions 4a from moving in a reverse direction away from acute corners of the recesses. In this state, the adjoining trays cannot unlock so as to separate sideways from each other, unless the locking means (lug and tab) are freed to enable the trays to slide in a reverse direction. It will now be apparent that since the protrusion 4 and recesses 3 of the same width or depth are arranged up and down (as seen in FIG. 3), the adjoining trays 1 in an assembly thereof are fixedly secured in position in a common plane providing a smooth surface. Furthermore, such an arrangement of the protrusions 4 in a staggered manner is also effective to enhance the resistance of said assembly to any bending stress.

In a preferable example of the first embodiment, the tray 1 has longitudinal longer sides 300 mm long, transverse sides 30 mm long, a thickness of 4 mm, and a pitch of protrusions 4 and recesses 3 of 20 mm whose height or depth were 2 mm (half the thickness of the tray). This example, not limiting the scope of the present invention, has proven excellent from all points of view.

Figure 6:
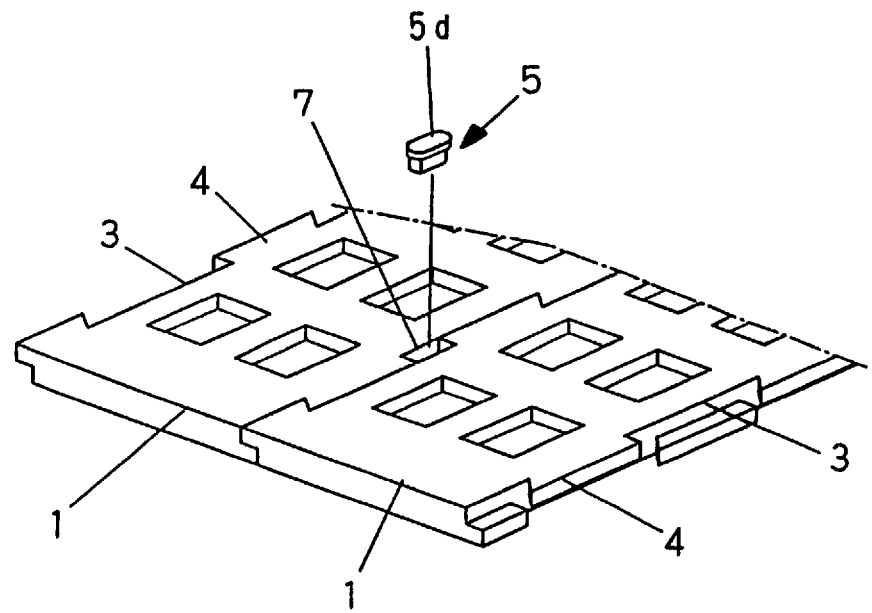
FIG. 6 is a perspective view of a modified example of the locking means.
Figure 7:
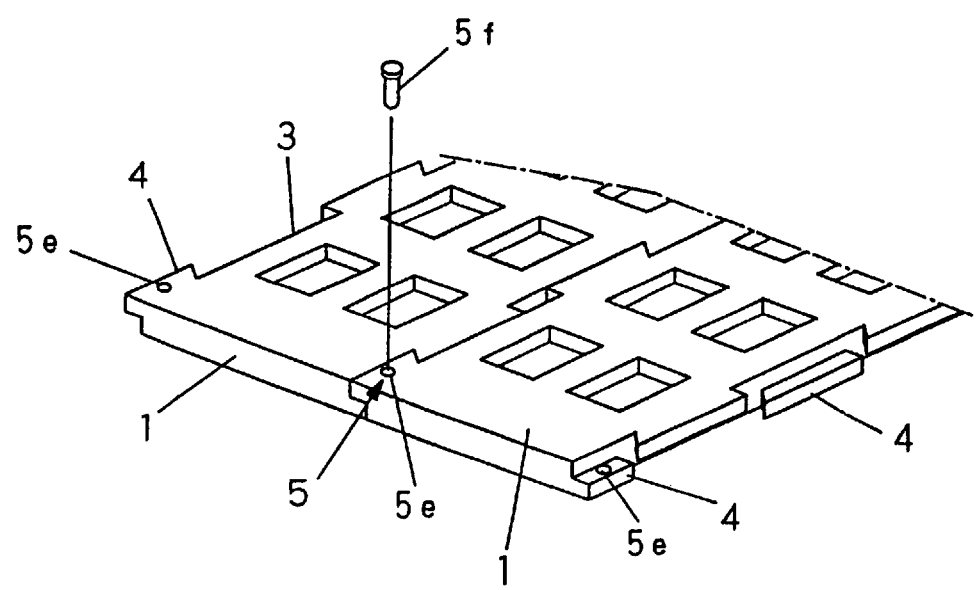
FIG. 7 is a perspective view of another modified example of the locking means.
Figure 8:
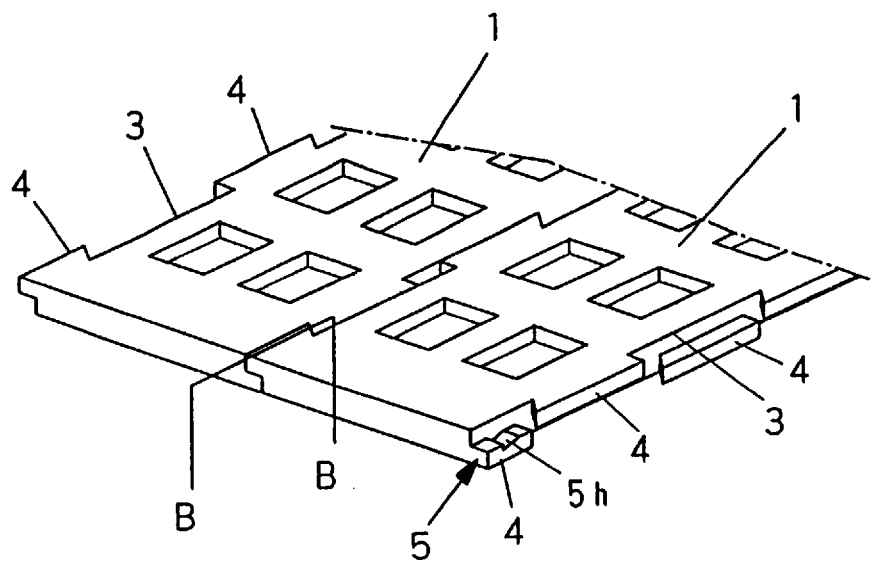
FIG. 8 is a perspective view of still another modified example of the locking means.
Figure 9:
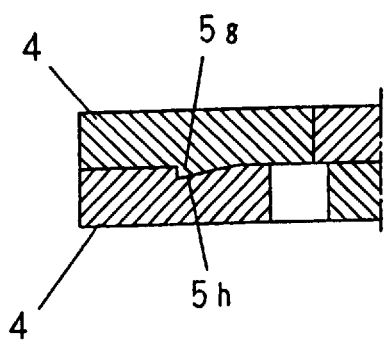
FIG. 9 is an enlarged cross section taken along the line B—B in FIG. 8.

The locking means 5 may be replaced with any one of the modified examples that will be summarized below. FIG. 6 shows a first example in which a plug 5d is employed to be forced into a rectangular opening 7. This opening will appear between each protrusion 4 and the corresponding recess 3 upon mutual sliding of the adjoining trays 1. A second example shown in FIG. 7 employs a pin 5f for mating with round apertures 5e formed through one pair of the corresponding protrusions 4. The pin 5f will be inserted in the apertures 5e, upon alignment thereof with each other as a result of said mutual sliding. In a third example illustrated in FIGS. 8 and 9, one of the corresponding protrusions 4 has a tooth 5g capable of engaging with a complemental cutout 5h facing the tooth 5g and formed in a mating protrusion on another tray. The engagement of these teeth and cutouts will take place also when the adjoining trays are caused to slide relatively to an end point.

Figure 10:
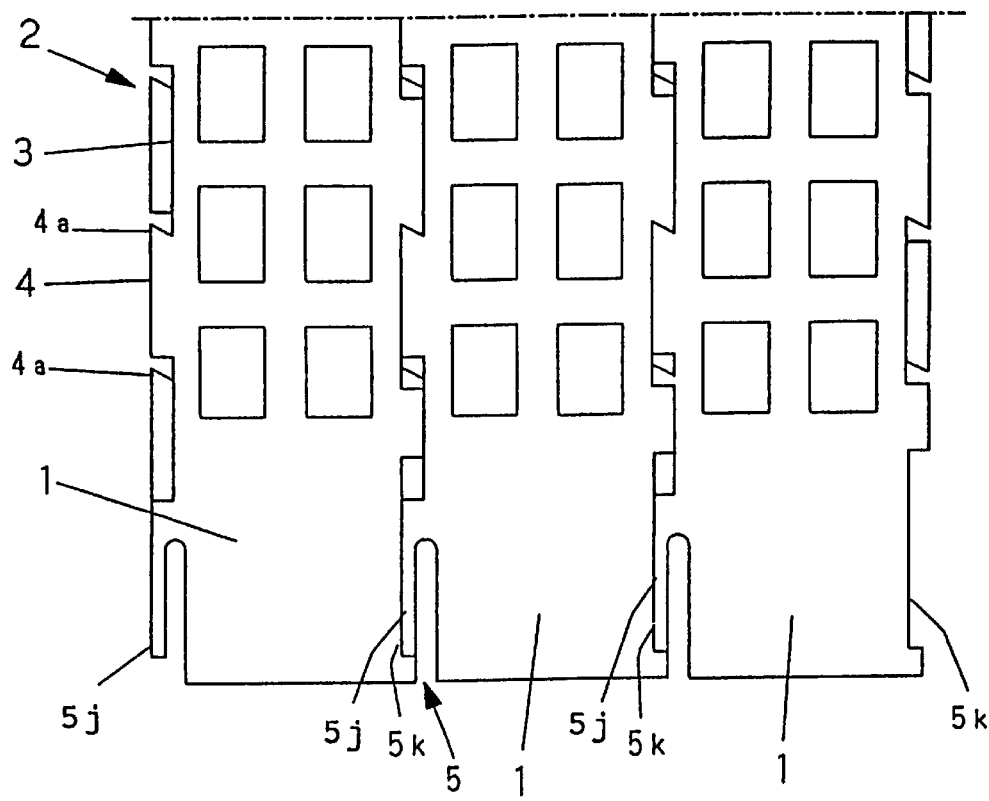
FIG. 10 is a perspective view of a further modified example of the locking means.

FIG. 10 shows a fourth modified example in which a U-shaped resilient tongue 5j is formed along one lateral side of the tray's body and near one of the transverse sides thereof, similarly to the pawl 5a mentioned above referring to FIGS. 1 to 5. A tongue receiving recess 5k is formed in the other lateral side so that the tongue 5j of one tray can snap in the tongue receiving recess 5k of the other tray, to thereby inhibit a further relative displacement of these adjoining trays in any undesirable direction.

The second embodiment of the present invention is illustrated in FIG. 11. The U-shaped hooking portion 4a employed in place of that which is provided in the first embodiment does consist of the L-shaped leg 4c. This leg defines between it and the longitudinal side a groove 4d, such that a row of such legs 4c on one tray can firmly fit in a row of the grooves 4d possessed by the other tray. This structure affords a more reliable and much stronger connection of the adjoining trays.

The embodiments and examples described above may be modified in any manner within the objects and scope of the present invention, and without impairing the features and advantages discussed above. For instance, the parts receiving compartments 6 formed in the upper face of each tray 1 may be of any shape and/or size complemental to those of the electronic or mechanical parts to be received therein. The tray may not necessarily be made of plastic, but any proper metal may be mechanically processed to give the required shape.

In summary, any desired number of the trays provided herein can be jointed together to give an assembly of any size. A few or several such trays can now be manufactured in a single mold enabling mass production and cost reduction. It is no longer necessary for the users to operate their assembly lines or factories with differently sized-nonversatile trays.

The assembly of unit trays can readily be disintegrated into the unit trays, if necessary when the parts are surface-mounted at high speeds onto a printed circuit board or when the parts are delivered in smaller lots from a parts supplier. The parts need not be reloaded onto smaller trays of unchangeable sizes, whereby work efficiency will be improved protecting those parts from any damage such as an accidental bending of electrodes or a breakage of electrostatic insulation.

It is one of the most prominent features of the present invention that the protrusions and recesses are included in the overall thickness of the tray's body and arranged up and down to be staggered along each longitudinal side of the unit tray. Consequently, the adjoining trays in an assembly thereof can readily be brought into and held in position in a common flat plane, enhancing the resistance of said assembly to any bending stress.

The foregoing relates to preferred exemplary embodiments of the invention, it being understood that other variants and embodiments thereof are possible within the spirit and scope of the invention, the latter being defined by the appended claims.

What is claimed and desired to be secured by Letters Patent of the United States is:

1. A parts transporting tray comprising:
   a rectangular planar body of an overall thickness and having an upper face, two opposing longitudinal sides extending longitudinally of the body in parallel with each other and transverse sides perpendicular to the longitudinal sides;
   a plurality of parts receiving compartments formed in the upper face;
   two rows of detention means respectively formed extending laterally from and integrally with the longitudinal sides such that adjacent trays are capable of firmly engaging one with another;
   each said row consisting of an upper and a lower series of alternating protrusions and recesses formed at a constant pitch, and each series being one of two complementary portions of the overall thickness of the body;
   a locking means for releasably keeping engaged the detention means of the adjacent trays;
   each recess in the upper series being defined above the corresponding protrusion of the lower series and between the adjacent two protrusions of the upper series, with each protrusion of the lower series thereby serving as a bottom of the corresponding recess of the upper series;
   each protrusion having a hook portion that faces either transverse side;
   the protrusions included in both the series on each longitudinal side being staggered, with the protrusions in each series on one longitudinal side being also staggered with respect to the protrusions included in the corresponding series on the other longitudinal side,
   whereby the protrusions on one tray are allowed to loosely fit in the respective recesses on another tray and subsequently the one tray is caused to slide relative to the other until the adjacent protrusions in each series on the trays come into engagement with each other at their hook portions.

2. A parts transporting tray as defined in claim 1, wherein each hook portion facing either transverse side of the body of said tray is formed by an edge of an acute angle defined by and between a slanted wall portion of and a lateral side of the protrusion.

3. A parts transporting tray as defined in claim 1, wherein each hook means is a U-shaped portion consisting of an L-shaped leg that defines between it and the longitudinal side a groove such that a row of such L-shaped legs on one tray are capable of firmly interfitting into a row of the grooves possessed by the other tray.

4. A parts transporting tray as defined in claim 2, wherein the locking means comprises a resilient pawl and a lug both formed integral with the tray's body at its portion located close to one of the transverse sides, and wherein the pawl is located on one of the lateral sides of said body, with the lug being disposed on the other lateral side, the resilient pawl having at its end an outwardly protruding tab engageable with the lug of an adjoining tray to resist any transverse force imparted sideways thereto, and thus maintain its neutral position lying in parallel with the body of the tray.

5. A parts transporting tray as defined in claim 3, wherein the locking means comprises a resilient pawl and a lug both formed integral with the tray's body at its portion located close to one of the transverse sides, and wherein the pawl is located on one of the lateral sides of said body, with the lug being disposed on the other lateral side, the resilient pawl having at its end an outwardly protruding tab engageable with the lug of an adjoining tray to resist any transverse force imparted sideways thereto, and thus maintain its neutral position lying in parallel with the body of the tray.

6. A parts transporting tray as defined in claim 2, wherein the locking means consists of a plug capable of being forced into a rectangular opening that is defined between each protrusion and the corresponding recess upon the sliding together of the adjoining trays.

7. A parts transporting tray as defined in claim 3, wherein the locking means consists of a plug capable of being forced into a rectangular opening that is defined between each protrusion and the corresponding recess upon the sliding together of the adjoining trays.

8. A parts transporting tray as defined in claim 2, wherein the locking means consists of a pin for mating with round apertures that are formed through one pair of the corresponding protrusions, the pin being inserted in the apertures upon alignment thereof with each other as a result of the sliding together of the adjoining trays.

9. A parts transporting tray as defined in claim 3, wherein the locking means consists of a pin for mating with round apertures that are formed through one pair of the corresponding protrusions, the pin being inserted in the apertures upon alignment thereof with each other as a result of the sliding together of the adjoining trays.

10. A parts transporting tray as defined in claim 2, wherein the locking means consists of a tooth formed on one of the corresponding protrusions and capable of engaging with a cutout that faces the tooth and is formed in the other protrusion, the engagement of these teeth and cutouts taking place when adjoining trays are caused to slide relative to an end point.

11. A parts transporting tray as defined in claim 3, wherein the locking means consists of a tooth formed on one of the corresponding protrusions and capable of engaging with a cutout that faces the tooth and is formed in the other protrusion, the engagement of these teeth and cutouts taking place when adjoining trays are caused to slide relative to an end point.

12. A parts transporting tray as defined in claim 2, wherein the locking means comprises a U-shaped resilient tongue formed along a portion of one side of the tray and near one of the transverse longitudinal sides thereof and a tongue receiving depression formed in the other longitudinal side, the tongue of one tray being capable of snapping into the tongue receiving depression of the other tray to thereby inhibit a further relative displacement of adjoining trays in an undesirable direction.

13. A parts transporting tray as defined in claim 3, wherein the locking means comprises a U-shaped resilient tongue formed along a portion of one side of the tray and near one of the transverse longitudinal sides thereof and a tongue receiving depression formed in the other longitudinal side, the tongue of one tray being capable of snapping into the tongue receiving depression of the other tray to thereby inhibit a further relative displacement of adjoining trays in an undesirable direction.

14. A parts transporting tray as defined in claim 2, wherein the tray is made of plastic.

15. A parts transporting tray as defined in claim 3, wherein the tray is made of plastic.

16. A parts transporting tray as defined in claim 2, wherein the tray is made of a metal.

17. A parts transporting tray as defined in claim 3, wherein the tray is made of a metal.

18. A parts transporting tray as defined in claim 1, wherein each series in the row of the protrusions and recesses is substantially half the overall thickness of the body.

19. A parts transporting tray as defined in claim 2, wherein each series in the row of the protrusions and recesses is substantially half the overall thickness of the body.

20. A parts transporting tray as defined in claim 2, wherein each series in the row of the protrusions and recesses is substantially half the overall thickness of the body.

* * * * *